(12) United States Patent
Duan et al.

(10) Patent No.: US 9,197,797 B2
(45) Date of Patent: Nov. 24, 2015

(54) CAMERA MODULE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Guo-Hua Duan, Shenzhen (CN); Fu-Chun Li, Shenzhen (CN); Yong Li, Shenzhen (CN); Yu-Shu Lin, New Taipei (TW); Shu-Sheng Peng, Shenzhen (CN); Wen-Hsiung Chen, New Taipei (TW); Shin-Wen Chen, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 112 days.

(21) Appl. No.: 14/067,960

(22) Filed: Oct. 31, 2013

(65) Prior Publication Data
US 2015/0015779 A1    Jan. 15, 2015

(30) Foreign Application Priority Data
Jul. 12, 2013    (CN) .................. 2013 1 02925835

(51) Int. Cl.
H04N 5/225    (2006.01)

(52) U.S. Cl.
CPC ........... *H04N 5/2253* (2013.01); *H04N 5/2252* (2013.01); *H04N 5/2257* (2013.01); *H01L 2924/3025* (2013.01)

(58) Field of Classification Search
None
See application file for complete search history.

(56) References Cited

U.S. PATENT DOCUMENTS

| | | | | |
|---|---|---|---|---|
| 5,940,271 | A * | 8/1999 | Mertol | 361/704 |
| 6,011,304 | A * | 1/2000 | Mertol | 257/706 |
| 7,997,812 | B2 * | 8/2011 | Kim | 396/529 |
| 8,054,634 | B2 * | 11/2011 | Seo | 361/728 |
| 8,436,931 | B2 * | 5/2013 | Lee et al. | 348/340 |
| 8,643,798 | B2 * | 2/2014 | Onishi et al. | 349/40 |
| 2001/0050717 | A1 * | 12/2001 | Yamada et al. | 348/340 |
| 2003/0080434 | A1 * | 5/2003 | Wataya | 257/774 |
| 2005/0056903 | A1 * | 3/2005 | Yamamoto et al. | 257/433 |
| 2005/0285973 | A1 * | 12/2005 | Singh et al. | 348/374 |
| 2006/0278946 | A1 * | 12/2006 | Shiraishi et al. | 257/433 |
| 2007/0030334 | A1 * | 2/2007 | Nishizawa | 347/245 |
| 2007/0097518 | A1 * | 5/2007 | Sanou et al. | 359/694 |
| 2007/0145571 | A1 * | 6/2007 | Lee et al. | 257/706 |
| 2007/0187791 | A1 * | 8/2007 | Yamamoto et al. | 257/433 |
| 2008/0143871 | A1 * | 6/2008 | Go | 348/374 |
| 2009/0009975 | A1 * | 1/2009 | Seo | 361/728 |
| 2009/0033790 | A1 * | 2/2009 | Lin | 348/374 |
| 2009/0079863 | A1 * | 3/2009 | Aoki et al. | 348/374 |
| 2009/0115891 | A1 * | 5/2009 | Ryu et al. | 348/374 |
| 2010/0182529 | A1 * | 7/2010 | Nakanishi | 349/58 |
| 2010/0265389 | A1 * | 10/2010 | Mizumura | 348/374 |

(Continued)

*Primary Examiner* — Michael Osinski
(74) *Attorney, Agent, or Firm* — Novak Druce Connolly Bove + Quigg LLP

(57) ABSTRACT

A camera module includes an image sensor, a circuit board, and a stiffener. The stiffener is located one side of the circuit board and includes a bottom plate grounded. The image sensor is located on another side of the circuit board. The stiffener includes a sidewall extending from the bottom plate. The sidewall and the bottom plate cooperatively hold the circuit board. An insulative coating is coated on the sidewall to avoid short circuiting.

8 Claims, 2 Drawing Sheets

(56) References Cited

U.S. PATENT DOCUMENTS

| | | | |
|---|---|---|---|
| 2011/0037155 A1* | 2/2011 | Pagaila | 257/686 |
| 2011/0080515 A1* | 4/2011 | Kang | 348/374 |
| 2011/0096224 A1* | 4/2011 | Lee | 348/374 |
| 2011/0130177 A1* | 6/2011 | Halliday | 455/575.1 |
| 2011/0134307 A1* | 6/2011 | Lee et al. | 348/342 |
| 2011/0147912 A1* | 6/2011 | Karpur et al. | 257/687 |
| 2011/0199485 A1* | 8/2011 | Nakamura | 348/148 |
| 2011/0216238 A1* | 9/2011 | Fujii et al. | 348/374 |
| 2011/0234893 A1* | 9/2011 | Koseki | 348/374 |
| 2011/0266587 A1* | 11/2011 | Naruse et al. | 257/99 |
| 2011/0285889 A1* | 11/2011 | Cho et al. | 348/308 |
| 2012/0002102 A1* | 1/2012 | Sekimoto | 348/374 |
| 2012/0012180 A1* | 1/2012 | Abiko | 136/256 |
| 2012/0206682 A1* | 8/2012 | Onishi et al. | 349/138 |
| 2013/0038209 A1* | 2/2013 | Akasaka et al. | 315/77 |
| 2013/0056863 A1* | 3/2013 | Chi et al. | 257/704 |
| 2014/0028905 A1* | 1/2014 | Kim | 348/374 |
| 2014/0210065 A1* | 7/2014 | Nishimura et al. | 257/676 |
| 2014/0313403 A1* | 10/2014 | Chen | 348/373 |
| 2014/0339668 A1* | 11/2014 | Arima et al. | 257/443 |
| 2014/0368723 A1* | 12/2014 | Jung et al. | 348/340 |
| 2015/0015778 A1* | 1/2015 | Lee | 348/373 |
| 2015/0062421 A1* | 3/2015 | Kwon et al. | 348/374 |

* cited by examiner

CAMERA MODULE

BACKGROUND

1. Technical Field

The present disclosure relates to camera modules and, particularly, to a camera module having performance of electrostatic prevention.

2. Description of Related Art

Camera modules include a barrel, a holder, a substrate, and a circuit board. The barrel is held in the holder. The holder is located on the circuit board via the substrate.

A stiffener is placed under the circuit board and used to support the camera module. The camera module may be affected by static electricity, thus, the performance of camera module may be reduce.

Therefore, it is desirable to provide a camera module, which can overcome the limitation described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
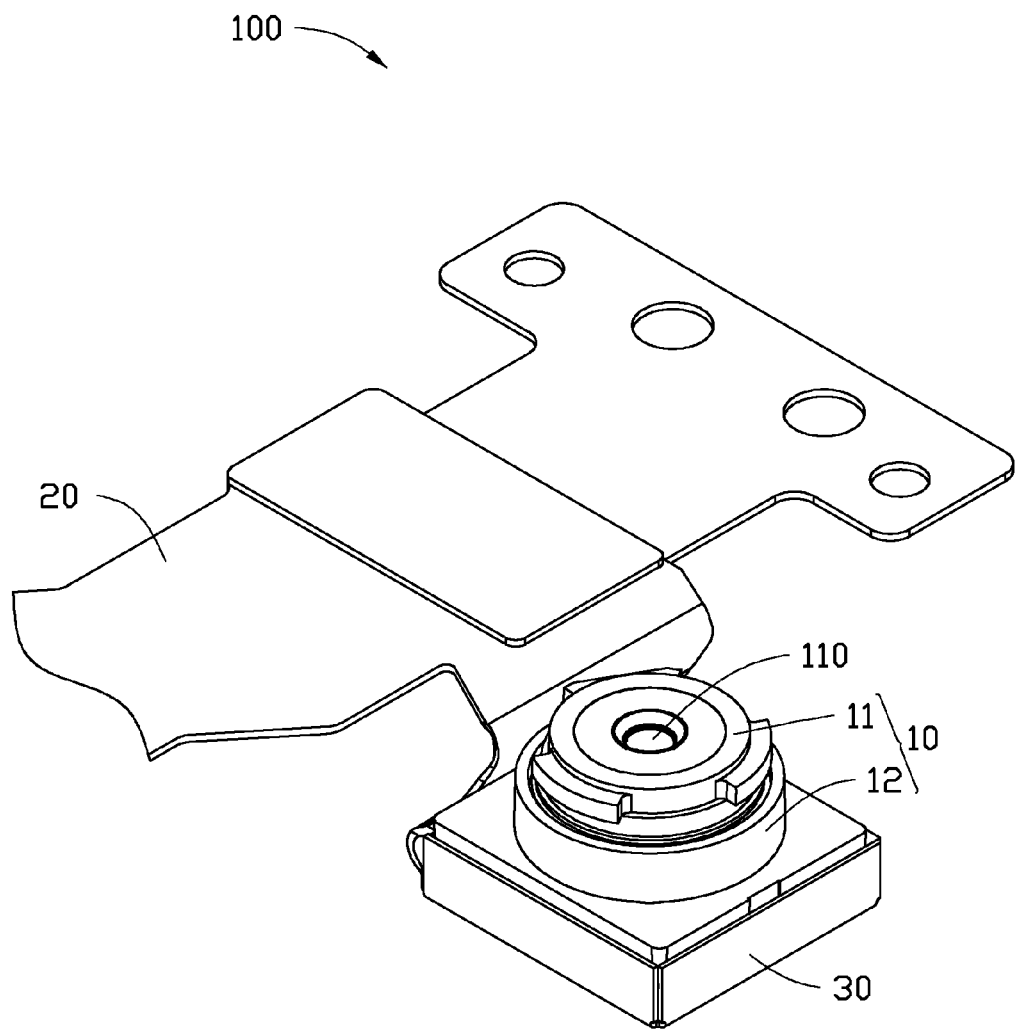
FIG. 1 is a schematic view of a camera module, according to an exemplary embodiment of the present disclosure.
Figure 2:
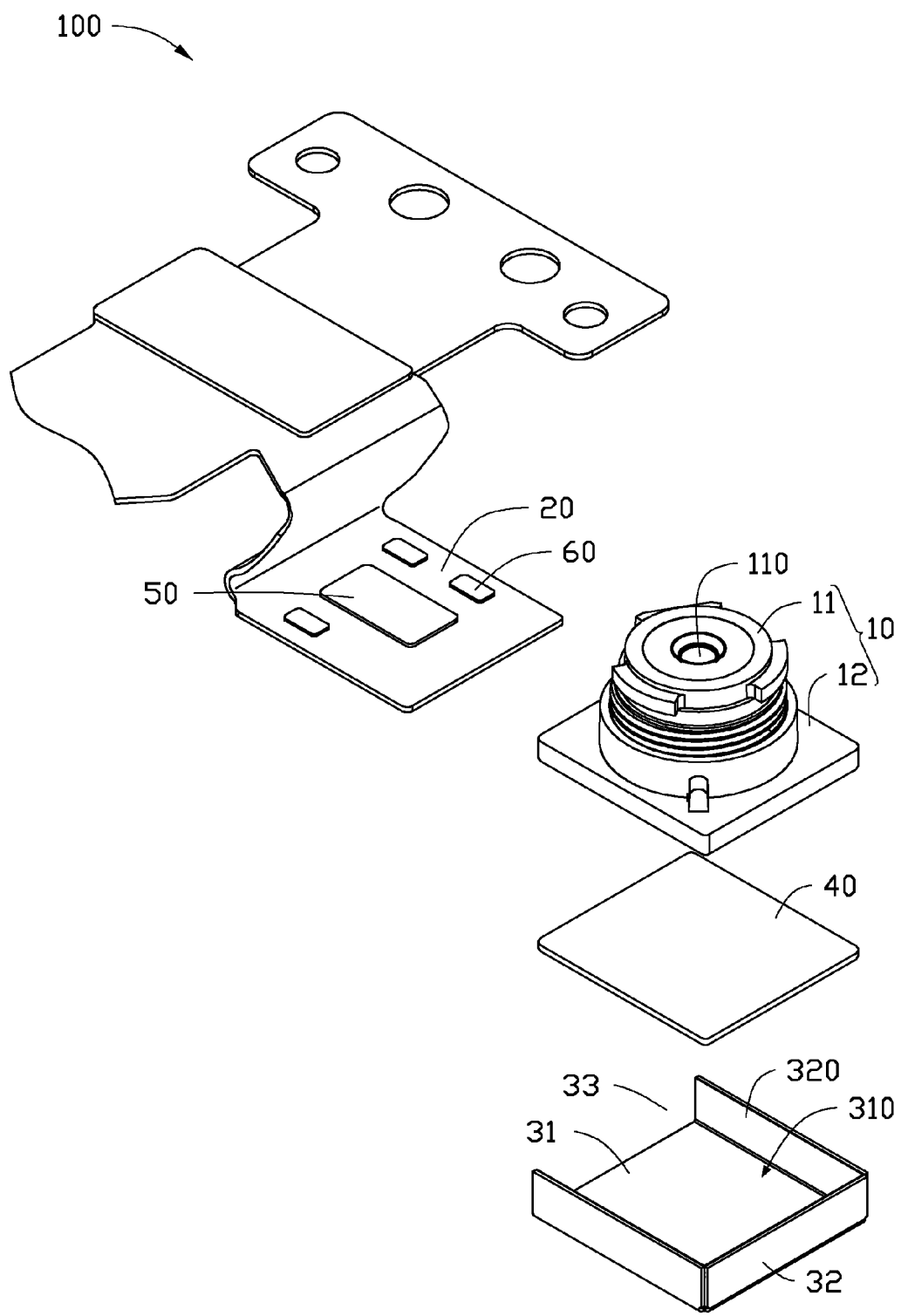
FIG. 2 is an explosive view of FIG. 1.

FIG. 1 and FIG. 2 show a camera module 100. The camera module 100 includes a lens module 10, a circuit board 20, a stiffener 30, a conductive adhesive 40, an image sensor 50, and electronic components 60.

The lens module 10 includes a barrel 11 and a holder 12. Optical units 110 are located in the barrel. The optical units 110 include lenses, IR filters, spacers, etc. The barrel 11 is screwed in the holder 12. The holder 12 is located on the circuit board 20, thus, the lens module 10 is located on the circuit board 20. The circuit board 20 can be a hard circuit board or a flexible circuit board. In this embodiment, the circuit board 20 is a flexible circuit board.

The image sensor 50 and the electronic components 60 are electrically located on the circuit board 20. The circuit board 20 extends from one side of the stiffener 30 and connects other units of the camera module 100. The image sensor 50 can be CCD sensor or CMOS sensor. The electronic components 60 can be resistors, capacitors, processors, etc.

The stiffener 30 includes a bottom plate 31 and three sidewalls 32. The bottom plate 31 has a square shape. The three sidewalls 32 extend from three sides of the bottom plate 31 in the same direction. All the three sidewalls 32 have a same height. The three sidewalls 32 define an opening 33. The circuit board 20 protrudes out of the stiffener 30 from the opening 33. The stiffener 30 defines a space 310 for holding the image sensor 50 and the electronic components 60. The height of the sidewalls 32 is not less than the height of the image sensor 50 or the electronic components 60.

In other embodiments, the bottom plate 31 can be other shapes, for example, circular.

The material of the stiffener 30 is selected from copper, copper alloy, and plastic. The stiffener 30 can be made by ejection process or stamping process.

An insulative coating 320 is coated on inside surface of each sidewall 32. The insulative coating 320 can avoid short circuit between the lens module 10 and other units of the camera module 100. The material of the insulative coating 320 can be printing ink.

The conductive adhesive 40 is located on the bottom plate 31 of the stiffener 30 and located under the circuit board 20, thus, the stiffener 30 can be grounded through the circuit board 20.

The material of the conductive adhesive 40 can be Anisotropic Conductive Film (ACF).

The bottom plate 31 of the stiffener 30 has the function of supporting the lens module 10 and the circuit board 20, at same time, the bottom plate 31 is ground. The insulative coating 32 of the sidewall 32 can avoid short circuit of the image sensor 50 and the electronic components 60.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A camera module, comprising:
an image sensor;
a circuit board; and
a stiffener located on one side of the circuit board, the stiffener comprising a bottom plate configured for being grounded, the image sensor located on another side of the circuit board, wherein the stiffener comprises at least one sidewall extending from the bottom plate, the at least one sidewall and the bottom plate cooperatively hold the circuit board, the stiffener comprises an insulative coating coated on the at least one sidewall of the stiffener to avoid short circuiting;
wherein the at least one sidewall comprises three sidewalls, the three sidewalls extend from three sides of the bottom plate in the same direction, all the three sidewalls have a same height, the three sidewalls define an opening, the circuit board protrudes out of the stiffener from the opening, and the insulative coating is coated on an inner surface of each sidewall.

2. The camera module of claim 1, comprising a lens module, the lens module located on the circuit board and covering the image sensor.

3. The camera module of claim 1, comprising a conductive adhesive, the conductive adhesive positioned on the bottom plate of the stiffener to make the stiffener connect with the circuit board.

4. The camera module of claim 3, wherein the conductive adhesive is anisotropic conductive film.

5. The camera module of claim 1, wherein the material of the insulative coating is printing ink.

6. The camera module of claim 1, wherein the material of the stiffener is selected from the group consisting of copper, copper alloy, and plastic.

7. The camera module of claim 1, wherein the bottom plate is in a square shape.

8. The camera module of claim 1, wherein the bottom plate is in a circular shape.

* * * * *